US006415352B1

(12) United States Patent
Asami et al.

(10) Patent No.: US 6,415,352 B1
(45) Date of Patent: Jul. 2, 2002

(54) ONE-CHIP MICROCOMPUTER AND METHOD OF REFRESHING ITS DATA

(75) Inventors: Takashi Asami, Saitama; Mitsumasa Kurihara, Gunma; Makoto Motegi, Saitama; Katsumi Tatekawa, Gunma, all of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/503,516

(22) Filed: Feb. 14, 2000

(30) Foreign Application Priority Data

Feb. 24, 1999 (JP) ............................................. 11-046738

(51) Int. Cl.$^7$ ............................................. G11C 16/06
(52) U.S. Cl. ...................... 711/103; 711/101; 711/102; 711/104; 711/106; 711/115; 365/185.08; 365/185.09; 365/185.22
(58) Field of Search ...................... 711/101–104, 106; 365/185.03, 185.09, 185.22

(56) References Cited

U.S. PATENT DOCUMENTS 6,075,723 A * 6/2000 Naiki et al. ............. 365/185.03
6,151,246 A * 11/2000 So et al. ................. 365/185.09
6,208,560 B1 * 3/2001 Tanaka et al. .......... 365/185.22

FOREIGN PATENT DOCUMENTS

JP 08-279295 10/1996
JP 08279295 A * 10/1996

* cited by examiner

*Primary Examiner*—Than Nguyen
(74) *Attorney, Agent, or Firm*—Fish & Richardson P.C.

(57) ABSTRACT

Reference nonvolatile memory groups in that data are easily erased during reading operation in comparison with a nonvolatile memory in a memory cell array is provided. Under control of a control circuit, data that is stored in the nonvolatile memory (7) is rewritten into the memory in accordance with the result of referring to the reference nonvolatile memory. Thus, the data characteristic of the memory is improved by rewriting data into the nonvolatile memory before a reading failure occurs.

4 Claims, 6 Drawing Sheets

ONE-CHIP MICROCOMPUTER AND METHOD OF REFRESHING ITS DATA

BACKGROUND OF THE INVENTION

The present invention relates to a one-chip microcomputer containing a nonvolatile memory of which the data is electrically erasable, and a method for refreshing data in the one-chip microcomputer. More particularly, the invention relates to the improvement of a data retaining characteristic of a nonvolatile memory.

FIG. 8 is a view showing a cell structure in a nonvolatile memory, generally used, of the split gate type when it is in a programmed state. In the figure, reference numeral 1 is a control gate; 2 is a floating gate; 3 is a drain; and 4 is a source.

To set up a programmed state (i.e. programming mode) in the nonvolatile memory of FIG. 8, 2V, 0V and 12V are applied to the control gate 1, the drain 3 and the source 4 of the nonvolatile memory, respectively. In the cell structure, the control gate 1 and the floating gate 2 are capacitively coupled with each other, and the floating gate 2 and the source 4 are also capacitively coupled with each other (capacitance between the control gate 1 and the floating gate 2<capacitance between the floating gate 2 and the source 4). With such voltage application, because of a coupling capacitance ratio, the floating gate 2 is put in a state equivalent to a state that it is under high voltage of, for example, 11V, although no voltage is actually applied to the floating gate Under this condition, a channel which is continuous for electrons is formed between the drain 3 and the source 4. Hot electrons in the channel are injected into the floating gate 2 through an insulating film (not shown), so that the floating gate 2 is put in a state that it is negatively charged. This state is a programmed state of the nonvolatile memory.

FIG. 9 shows a cell structure showing a reading state of the nonvolatile memory when it is in a programmed state. FIG. 10 shows a cell structure showing a reading state of the nonvolatile memory when it is in a non-programmed state.

When the rading state is to be set in either of the nonvolatile memories of FIGS. 9 and 10, 5V, 2V and 0V, for example, are respectively applied to the control gate 1, the drain 3 and the source 4. In the cell structure of FIG. 9, electrons have been injected into the floating gate 2. Accordingly, no channel is formed between the drain 3 and the source 4, and the nonvolatile memory cell is turned off. In the cell structure of FIG. 10, no electrons are present in the floating gate 2. Accordingly, a channel is formed between the drain 3 and the source 4, and the nonvolatile memory cell is turned on.

FIG. 7 is a block diagram showing a circuit for outputting a binary logic value "0" or a binary logic value "1" in accordance with a programmed state of the nonvolatile memory cell. In the figure, reference numeral 5 is a nonvolatile memory cell and numeral 6 is a sense amplifier. The sense amplifier 6 outputs a voltage signal of 0V (binary logic value "0") or a voltage signal of 5V (binary logic value "1") in accordance with the result of comparing an output current (read current) of the nonvolatile memory cell 5 with a reference current Iref.

When the nonvolatile memory cell 5 is placed in a programmed state as shown in FIG. 9, the sense amplifier 6 senses that the output current (read current) of the nonvolatile memory cell 5 is smaller than the reference current Iref, and outputs a binary logic value "0". When the nonvolatile memory cell 5 is in a non-programmed state as shown in FIG. 10, the sense amplifier 6 senses that that the output current (read current) of the nonvolatile memory cell 5 is larger than the reference current Iref, and outputs a binary logic value "1". When the reference current drops to a value 30% of 100 $\mu$A as an initial value in a state that the nonvolatile memory cell 5 is in a non-programmed state (the erasing state), it is judged, by convention, that the memory cell reaches the lower limit of data rewriting operation margin or its life has terminated.

FIG. 11 is a diagram showing a cell structure showing an erasing state of the nonvolatile memory. When 14V is applied to the control gate 1, and 0V is applied to the drain 3 and the source 4, then electrons that are injected into the floating gate 2 migrate to the control gate 1 through the insulating film. In this case, no channel is formed since the drain 3 and the source 4 are at the equal potential. This state is the erasing state of the nonvolatile memory.

As described above, in the conventional nonvolatile memory, the fixed voltages are applied to the control gate 1, the drain 3 and the source 4 for fixed times in accordance with the programmed state, the reading state, and the erasing state of the nonvolatile memory.

In the one-chip microcomputer containing the thus constructed nonvolatile memory, when the nonvolatile memory is used in the form of a ROM, the data retaining characteristic of the memory is of great significant.

Particularly in a memory cell array structure shown in FIG. 12, voltage application conditions for a non-select cell encircled by a dotted line are the same as in the erasing state mentioned above except an amplitude of voltage (5V) applied to control gates 1 (word line WL) (in this cell array structure, the voltage applied thereto is 14V as mentioned above).

In the memory cell array structure, when the reading operation is repeated, the electrons that are charged into the floating gate 2 will creep to the control gate 1, possibly causing a reading failure. In particular in a case where a power source voltage is high, the electron creeping is remarkable.

SUMMARY OF THE INVENTION

Accordingly, an object of the present invention is to provide a one-chip microcomputer which improves the data retaining characteristic of the memory by rewriting data into the nonvolatile memory before a reading failure occurs, and a method of refreshing data in the one-chip microcomputer.

The present invention has been made to solve the above problems, a rewriting-number counter for counting the number of data rewriting operations is provided for each nonvolatile memory 7. When the count value of the counter reaches a desired value, data that is stored in the nonvolatile memory 7 is rewritten into the nonvolatile memory, whereby the data retaining characteristic of the memory is improved.

Further, reference nonvolatile memory groups 40 which are inferior in characteristics to a nonvolatile memory 7 in the memory cell array are provided. Under control of a control circuit 44, data that is stored in the nonvolatile memory 7 is rewritten into the memory in accordance with the result of referring to the nonvolatile memory groups 40, whereby the data retaining characteristic of the memory is improved. The reference nonvolatile memory groups 40 have each a cell structure of which the gate length is longer than or the gate width is shorter than of an internal nonvolatile memory 7. The reference nonvolatile memory groups 40 are all put in a programmed state ("0" state).

DETAILED DESCRIPTION OF THE PREFERRED EMBODIMENTS

The present invention will be described in detail with reference to the accompanying drawings.

Figure 3:
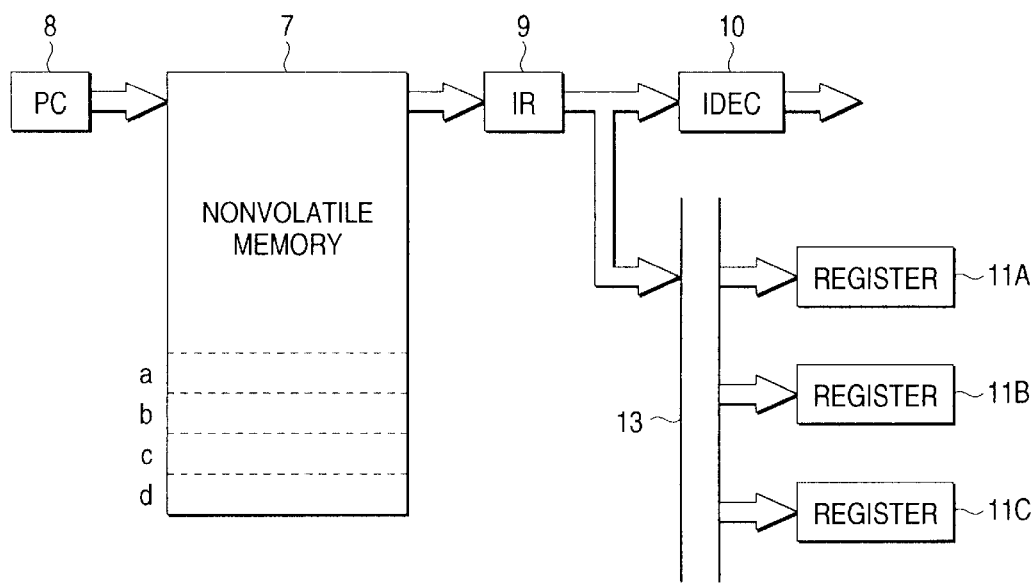
FIG. 3 is a block diagram showing a one-chip microcomputer constructed according to the present invention.

FIG. 3 is a block diagram showing a one-chip microcomputer constructed according to the present invention. In FIG. 3, reference numeral 7 is a nonvolatile memory (e.g., an EEPROM, and a flash EEPROM called also a flash memory). The nonvolatile memory 7 is such a memory that data stored in the memory may electrically be erased, and may also be read out repeatedly, and further data may be written into the memory repeatedly. Mainly program data for controlling the operations of the one-chip microcomputer is stored into the nonvolatile memory. Usually, writing, reading and erasing operations of each of the nonvolatile memory cells 5, which form the nonvolatile memory 7, are carried out in the states of FIGS. 8 to 11. At least the following data are stored in specific address areas "a" to "d" of the nonvolatile memory 7: control data A for controlling the amplitude or time of a writing voltage for the nonvolatile memory 7, control data B for controlling the amplitude or time of an erasing voltage for the nonvolatile memory 7, control data C for controlling the amplitude or time of a reading voltage for the nonvolatile memory 7, and control data D for controlling the amplitude of a reference voltage Vref (corresponding to the reference current Iref) of the sense amplifier 6 when the nonvolatile memory 7 is in a read mode.

Reference numeral 8 designates a program counter used for designates addresses in the nonvolatile memory 7. 9 specifying an instruction register for holding readout data from the nonvolatile memory 7. Numeral 10 designates an instruction decoder which decodes the data retained in the instruction register 9 and outputs control signals for performing various operations of the one-chip microcomputer. Reference numerals 11A, 11B and 11C are registers which hold the control data A, B and C at the addresses "a", "b" and "c" that are stored in the instruction register 9, via a data bus 13. The control data D of the address "d" in the nonvolatile memory 7 is the data referenced to in the reading operation, and is directly connected to a reference voltage part of the sense amplifier 6, and the reference voltage Vref is set up at an instant that the one-chip microcomputer is initialized. The erasing operation of the nonvolatile memory 7 is performed every page (e.g., 128 bytes), and therefore, such a disadvantage that the control data A, B and C at the specific addresses "a" to "d" are erased simultaneously with the erasing operation will never happen.

Figure 4:
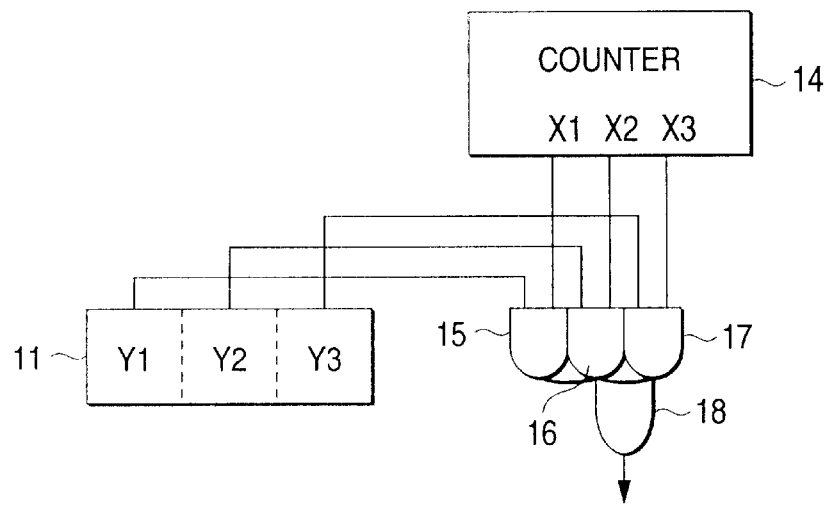
FIG. 4 is a block diagram showing a circuit for controlling writing time, erasing time and reading time.

FIG. 4 is a block diagram showing a circuit for controlling writing time, erasing time and reading time. It is assumed here that the control data A to C for controlling the writing time, erasing time and reading time are respectively stored in advance at the memory locations of the addresses "a" to "c" in the nonvolatile memory 7. In FIG. 4, reference numeral 14 is a counter formed with a plurality of T-type flip-flops connected in cascade fashion. AND gates 15 to 17, and an OR gate 18 form a select circuit. Specific frequency dividing output signals X1 to X3 (e.g., 0.4 msec, 0.8 msec and 1.6 msec) are applied to first input terminals of the AND gates 15 to 17, respectively. A register 11 stores control bits Y1 to Y3 for selecting one of the frequency dividing output signals X1 to X3. Those bits of the register 11 are connected to the second input terminals of the AND gates 15 to 17, respectively. The control bits Y1 to Y3 are "1's" in binary logic value when one of the frequency dividing output signals X1 to X3 is selected. Accordingly, one of the frequency dividing output signals X1 to X3, which correspond to one of the control bits Y1 to Y3, is output from the OR gate 18, to thereby control a voltage application time in the state of FIG. 8. In an example where in accordance with a writing characteristic of the nonvolatile memory 7, 0.4 msec is insufficiently long for the voltage application time but 0.8 msec is sufficient for the same, the control bit Y2 alone is "1" in binary logic value, and a writing operation is performed in accordance with the frequency dividing output signal X2 of the counter 14. Arrangements constructed as shown in FIG. 4 are provided also for the registers 11B and 11C for the easing and reading operations.

Figure 5:
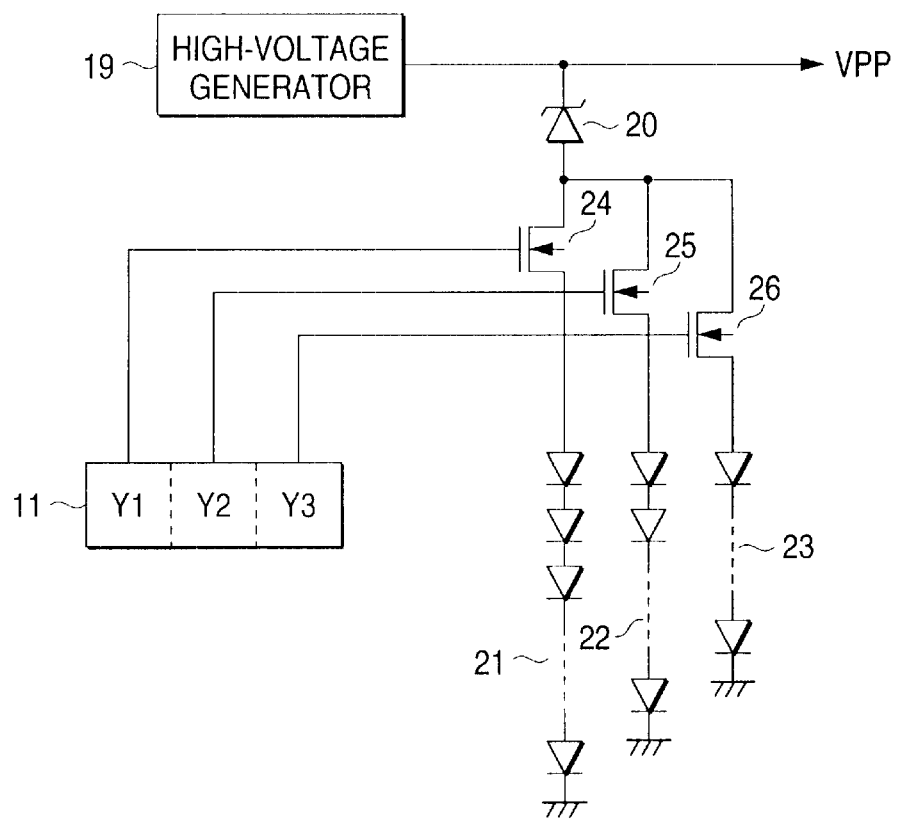
FIG. 5 is a circuit diagram showing a circuit for controlling writing voltage, erasing voltage and reading voltage.
Figure 8:
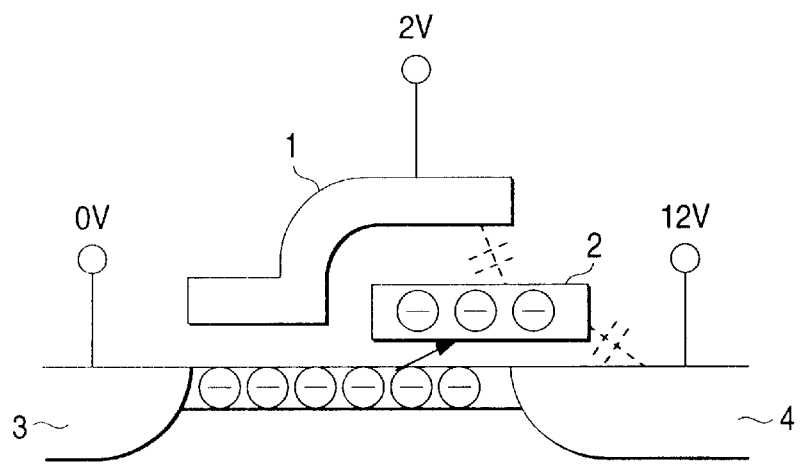
FIG. 8 is a view showing a cell structure in a nonvolatile memory when it is in a programmed state.
Figure 9:
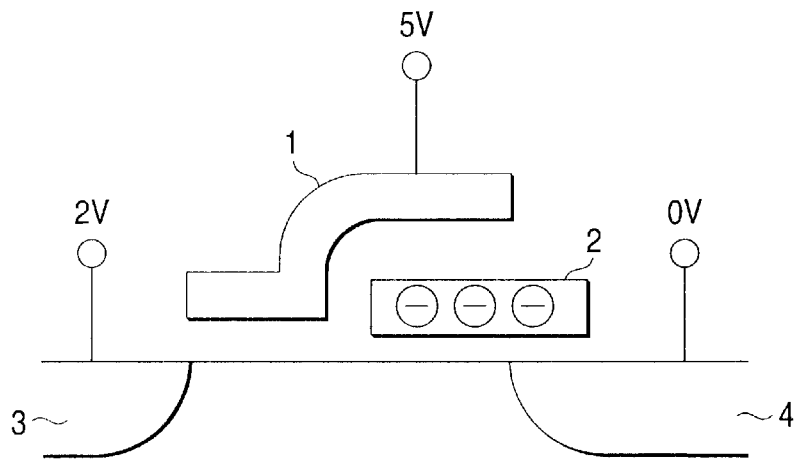
FIG. 9 shows a cell structure showing a reading state of the nonvolatile memory when it is in a programmed state.
Figure 10:
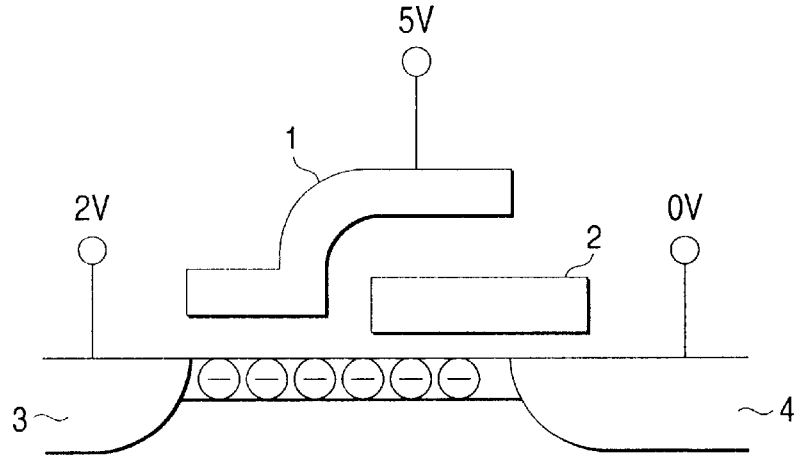
FIG. 10 shows a cell structure showing a reading state of the nonvolatile memory when it is in a non-programmed state.
Figure 11:
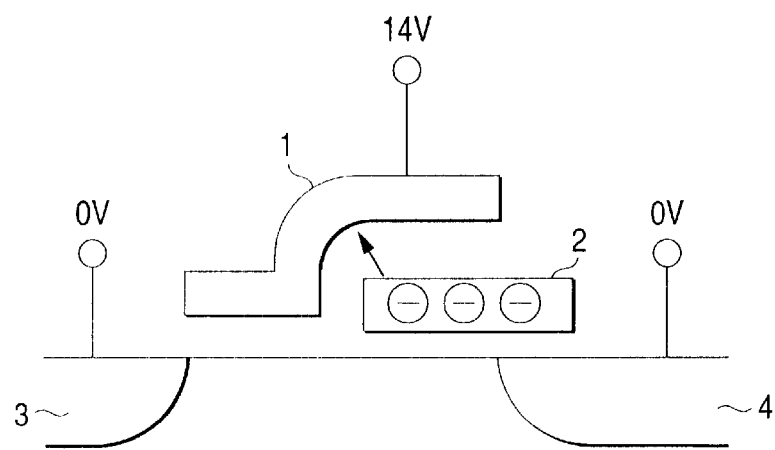
FIG. 11 is a diagram showing a cell structure showing an erasing state of the nonvolatile memory.
Figure 12:
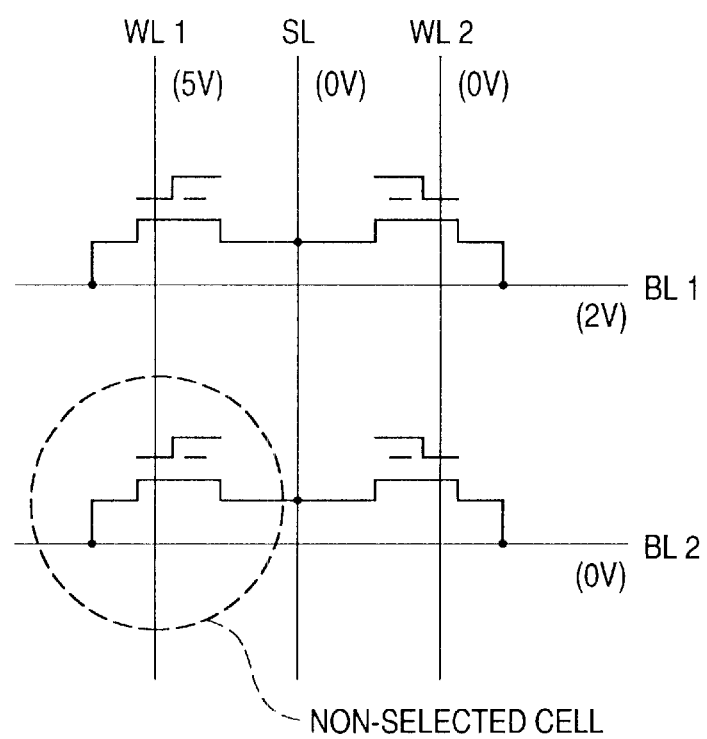
FIG. 12 is a diagram useful in explaining problems of a conventional nonvolatile memory.

FIG. 5 is a circuit diagram showing a circuit for controlling writing voltage, erasing voltage and reading voltage. It is assumed here that the control data A to C for controlling the writing voltage, erasing voltage and reading voltage, respectively, have been stored in advance at the memory locations of the addresses "a" to "c" in the nonvolatile memory 7 in accordance with respective operation characteristics of the nonvolatile memory 7. In FIG. 5, reference numeral 19 designates a high voltage generator circuit, and it generates a voltage VPP. The output of the high voltage generator circuit 19 is connected to the cathode of a Zener diode 20. The anode of the Zener diode 20 is coupled to the first ends of series circuits 21, 22 and 23 of diodes. Those series circuits, arranged in parallel, consist of "P", "q" and "r" numbers of diodes, respectively (p>q>r). Specifically, the drain-source paths of NMOS transistors 24, 25 and 26 are inserted between the anode of the Zener diode 20 and the first ends of the diode series circuits 21, 22 and 23. Those NMOS transistors 24, 25 and 26 are used for selectively connecting one of the diode series circuits 21 to 23 to the Zener diode 20 between the output of the high voltage generator circuit 19 and ground. The gates of the NMOS transistors 24, 25 and 26, respectively, are connected to the bits of the register 11A and controlled by the latter. The output voltage VPP of the high voltage generator circuit 19 decreases in the following order: when the NMOS transistors 24, 25 and 26 are all turned off, when the NMOS transistor 24 is turned off, when the NMOS transistor 25 is turned off, and when the NMOS transistor 26 is turned off. In an example where in accordance with a writing characteristic of the nonvolatile memory 7, a voltage level set up when the NMOS transistor 26 is turned on is insufficient for the writing voltage level but a voltage level set up when the NMOS transistor 25 is turned on is sufficient for the same under the condition that the voltage application time is fixed, the control bit Y2 alone is "1" in binary logic value, and the source voltage in FIG. 8 is controlled. Arrangements-constructed as shown in FIG. 5 are provided also for the registers 11B and 11C for the easing and reading operations. In this case, the control gate voltage in FIG. 11 is controlled.

Figure 6:
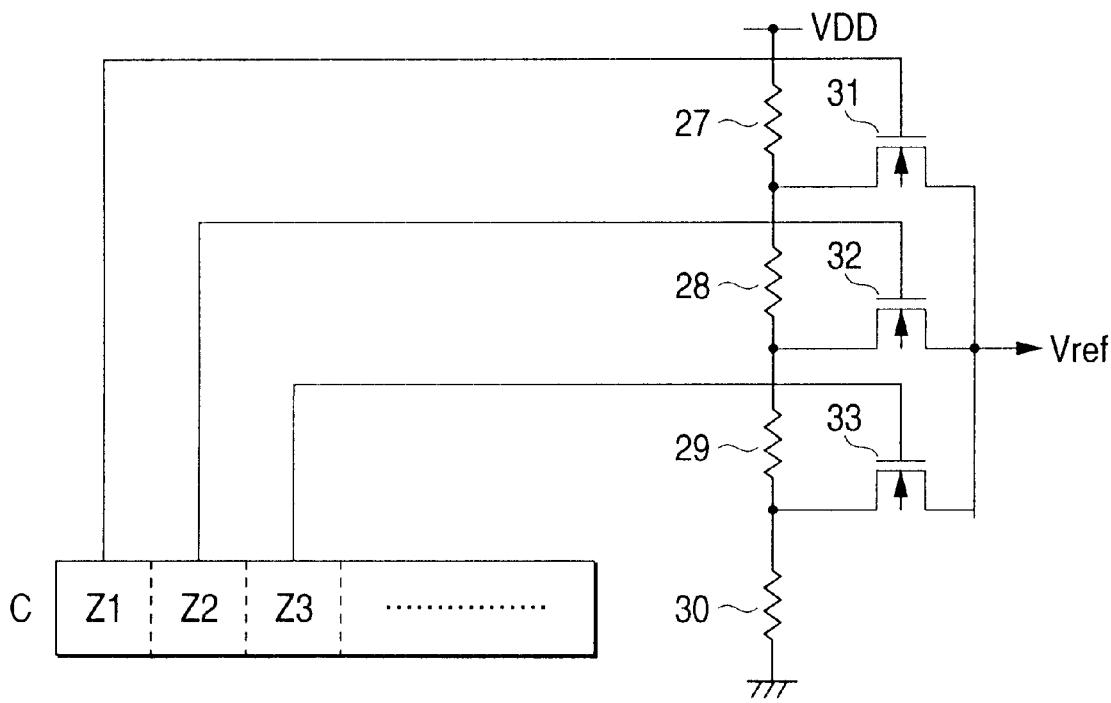
FIG. 6 is a circuit diagram showing a circuit for controlling the reference voltage Vref for the sense amplifier.

FIG. 6 is a circuit diagram showing a circuit for controlling the reference voltage Vref for the sense amplifier 6. To be more specific, an output current of the nonvolatile memory cell 5 and the reference current Iref are transformed into corresponding voltages in the sense amplifier 6, respectively. Accordingly, actually, the reference voltage Reference voltage Vref, not the reference current Iref, is applied to the sense amplifier 6. It is assumed that the control data D for controlling the reference voltage Vref has been written into the memory location of the address "d" in the nonvolatile memory 7 in accordance with the characteristic of the nonvolatile memory 7. A series circuit of resistors 27 to 30 is connected between a power source VDD and ground. The drains of the NMOS transistors 31 to 33 are connected to the connection points between the resistors 27 and 28, the resistors 28 and 29 and the resistors 29 and 30, respectively. The sources of those NMOS transistors are connected together. The gates of those transistors are directly controller by control bits Z1 to Z3 of the address "d". The reference voltage Vref decreases in the order of turning on the NMOS transistors 31 to 33. In an example where in accordance with the reading characteristic of the nonvolatile memory 7 a voltage level set up when the NMOS transistor 33 is turned on is insufficient for the reference voltage Vref but a voltage level set up when the NMOS transistor 32 is turned on is sufficient for the reference voltage Reference voltage Vref, setting the control bit Z2 alone to a binary logic value "1" will do. In this way, the sense amplifier 6 produces an exact binary logic value.

A construction essential to the present invention will be described with reference to FIG. 2.

Figure 2:
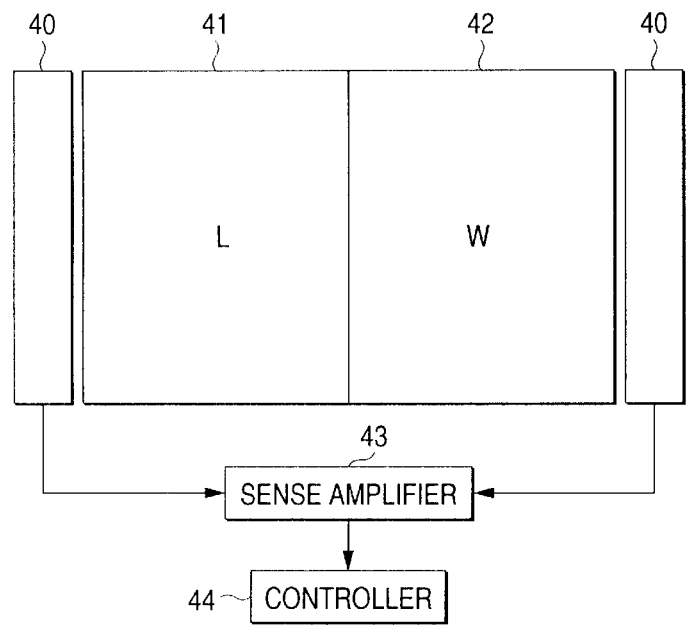
FIG. 2 is a diagram showing a layout of a memory cell array into which the present invention is incorporated.

FIG. 2 is a diagram showing a layout of a memory cell array into which the present invention is incorporated. In FIG. 2, reference numerals 41 and 42 indicate left and right and memory cell arrays. Nonvolatile memory groups 40 for reference are disposed adjacent to the ends of the memory cell arrays, respectively. Each of the nonvolatile memory groups 40 may be altered into a nonvolatile memory structured to be inferior in characteristic to the nonvolatile memory 7 (in this case, the stored data is more easily erased) if the cell structure is designed to have a gate length longer than that in the nonvolatile memory 7 or a gate width shorter than in the same. Reference numeral 43 is a sense amplifier for reading out data from the reference nonvolatile memory groups 40, and numeral 44 is a control circuit.

Figure 7:
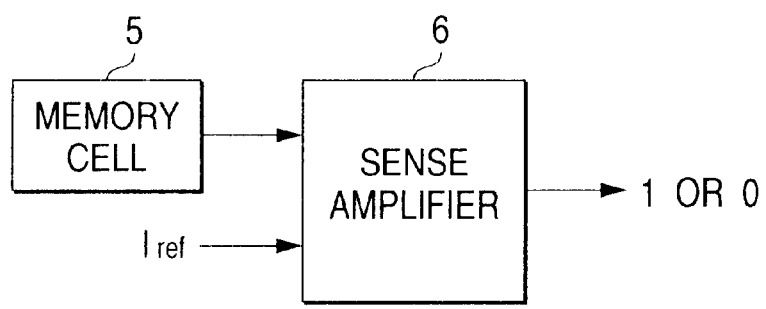
FIG. 7 is a block diagram showing a circuit for outputting a binary logic value, "0" or a binary logic value "1" in accordance with a programmed state of the nonvolatile memory cell.

The sense amplifier 43 has a circuit arrangement substantially equal to that of the nonvolatile memory 7. The same thing is true for the value of the reference current Iref. Only the following description about the sense amplifier will be given for avoiding the repeating of the same description. The output current of each memory cell and the reference current Iref, as shown in FIG. 7, are converted into corresponding voltages in the sense amplifier 43, respectively. Accordingly, actually, the reference current Iref is not fed to the sense amplifier 43, but the reference voltage Vref is applied to the same.

Figure 1A:
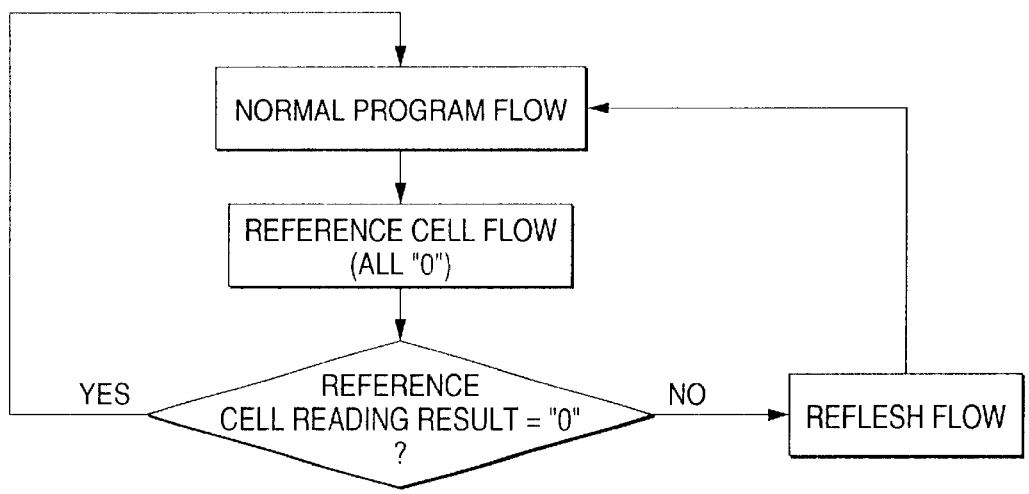
FIG. 1 is a flow chart showing operations of a one-chip microcomputer constructed according to the present invention.

In the nonvolatile memory 7 constructed as described above, a reading failure that is easy to occur in the conventional art is made less frequent in its occurrence, through a normal program flow (repeating the reading operation as shown in a flow chart of FIG. 1A. With provision of the reference nonvolatile memory groups 40 having the characteristic inferior to that of the nonvolatile memory 7, the reference nonvolatile memory groups 40 are all put in a programmed state ("0" state where data is stored). When the control circuit 44 detects a state change from the "0" state to a "1" state (state where data is erased) by the sense amplifier 43, it performs a data rewriting operation (data refreshing flow) as shown in the flow chart of FIG. 1A.

The data rewriting operation (data refreshing flow) is to rewrite data having the contents substantially equal to the data contents ("0", "1") stored in the nonvolatile memory 7, into the memory. Where the data rewriting operation is performed, the data is refreshed before the a reading failure occurs, so that the data retaining characteristic of the nonvolatile memory is improved.

In the embodiment, particularly the capability of a memory cell which is somewhat inferior in characteristic to an actual cell is observed. Such an observation soaks up a variability of the products every lot and the same caused by workmanship. Accordingly, the product may be set at a reference level adjusted to the capability of each LSI. As a consequence, production yields are also improved.

In the embodiment of the invention, every time the nonvolatile memory 7 in the memory cell array is subjected to the reading operation, the reference nonvolatile memories 40 that are connected to the same word line as of the nonvolatile memory 7 are also subjected to the reading operation. And when it is detected that the data in the reference nonvolatile memories 40 are erased during the sequential repetitive reading operations, data is rewritten into the memory cells under control of the control circuit 44.

Figure 1B:
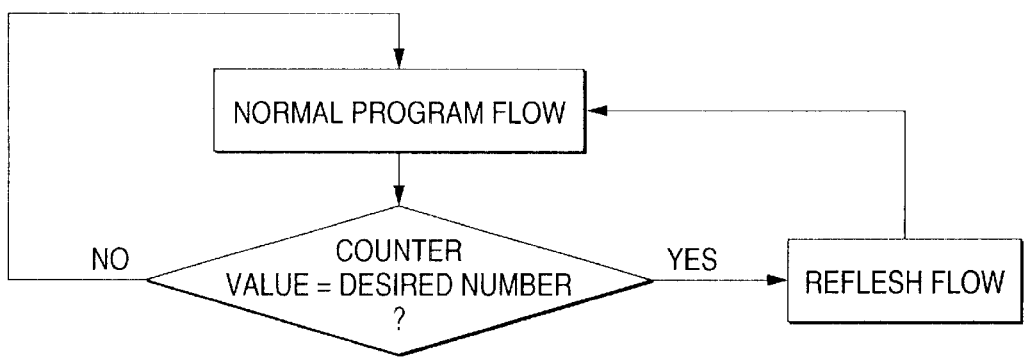

It should be understood that the present invention is not limited to the above-described embodiment, but it may variously be modified, altered and changed within the true spirits of the invention. In another embodiment, a reading-number counter (not shown) for counting the number of data reading operations is provided for each nonvolatile memory 7. When the count value of the counter reaches a desired value (actually, a frequency of reading failures is actually measured in advance, and the desired value is set at a value on the basis of the frequency of reading failures. It is set at 10,000 or 100,000 times, for example.), the one-chip microcomputer is operated as shown in FIG. 1B: the computer first executes a normal program flow, then a data refreshing flow, and the normal program flow again. This embodiment can also improve the data retaining characteristic of the nonvolatile memory.

Further, it is noted that the nonvolatile memory is incorporated into a one-chip microcomputer. Therefore, the present invention may be put into practice in such a simple manner that the reading-number counter is provided as mentioned above, and a circuit for storing the number of reading operations into the nonvolatile memory 7 is added for the periphery. In other words, the invention yields such an advantage that there is no need of using large additional circuits.

As seen from the foregoing description, a reading-number counter for counting the number of data reading operations is provided for each nonvolatile memory in the memory cell array, and data is rewritten into the nonvolatile memory before a reading failure occurs. Therefore, the improvement of the data retaining characteristic of the nonvolatile memory is achieved.

Further, data is written into reference nonvolatile memory groups which are inferior in characteristics to the nonvolatile memory in the memory cell array. When a reading failure is performed for the data in the reference nonvolatile memory groups, data is rewritten into the nonvolatile memory. Therefore, the data retaining characteristic of the nonvolatile memory is improved.

What is claimed is:

1. A one-chip microcomputer comprising:
   a nonvolatile memory in that data is electrically erasable and rewritable, as a program memory;
   a reference nonvolatile memory in that data are easily erased during reading operation in comparison with a nonvolatile memory in a memory cell array said reference nonvolatile memory set in a programmed state; and
   a control circuit for controlling as to rewrite data stored in said nonvolatile memory in accordance with the result of referring to said reference nonvolatile memory,
   wherein said control circuit detects that the data written in the reference nonvolatile memory is erased, and rewrites the data written in the nonvolatile memory in response to the detection result.

2. A one-chip microcomputer in accordance with claim 1, wherein said reference nonvolatile memory has a cell structure in which a gate length is longer than a gate length of said nonvolatile memory on said memory cell array, or a cell structure in which a gate width is shorter than a gate width of said nonvolatile memory in said memory cell array.

3. A method of refreshing data in a one-chip microcomputer comprising, as a program memory, a nonvolatile memory in that data is electrically erasable and rewritable, as a program memory; said method comprising:
   referring a reference nonvolatile memory in that data are easily erased during a reading operation in comparison with a nonvolatile memory in a memory cell array;
   setting said reference nonvolatile memory in a programmed state; and
   rewriting data that is stored in said nonvolatile memory in response to detecting that the data written in the reference nonvolatile memory is erased.

4. A data refreshing method in accordance with claim 3, wherein said reference nonvolatile memory has a cell structure in which a gate length is longer than a gate length of said nonvolatile memory on said memory cell array, or a cell structure in which a gate width is shorter than a gate width of said nonvolatile memory in said memory cell array.

* * * * *